US 9,101,045 B2

(12) United States Patent
Masaki et al.

(10) Patent No.: US 9,101,045 B2
(45) Date of Patent: Aug. 4, 2015

(54) SHIELD STRUCTURE FOR ELECTRONIC APPARATUS

(71) Applicant: KYOCERA Document Solutions Inc., Osaka-shi, Osaka (JP)

(72) Inventors: Akihiro Masaki, Osaka (JP); Yoshifumi Okauchi, Osaka (JP)

(73) Assignee: KYOCERA Document Solutions Inc., Osaka-shi (JP)

( * ) Notice: Subject to any disclaimer, the term of this patent is extended or adjusted under 35 U.S.C. 154(b) by 0 days.

(21) Appl. No.: 14/091,058

(22) Filed: Nov. 26, 2013

(65) Prior Publication Data

US 2014/0151110 A1    Jun. 5, 2014

(30) Foreign Application Priority Data

Nov. 30, 2012    (JP) .................................. 2012-263008

(51) Int. Cl.
*H05K 9/00* (2006.01)
*G03G 21/16* (2006.01)

(52) U.S. Cl.
CPC .......... *H05K 9/0058* (2013.01); *G03G 21/1619* (2013.01); *H05K 9/0037* (2013.01)

(58) Field of Classification Search
CPC .................................................. H05K 9/0037
USPC .......................... 174/350, 377, 382, 384, 387
See application file for complete search history.

(56) References Cited

U.S. PATENT DOCUMENTS 8,076,592 B2 * 12/2011 Lin et al. ........................ 174/359
2004/0130700 A1    7/2004 Ogi et al.

FOREIGN PATENT DOCUMENTS

| JP | 04096295 A | 3/1992 |
| JP | 2004177602 A | 6/2004 |
| JP | 2005294627 A | 10/2005 |

* cited by examiner

*Primary Examiner* — Hung V Ngo
(74) *Attorney, Agent, or Firm* — Alleman Hall McCoy Russell & Tuttle LLP

(57) ABSTRACT

A shield structure for an electronic apparatus includes a frame member and a shield box. The frame member is a conductive frame to which the wiring substrate is attached and covering a back surface of the wiring substrate. The shield box is formed on a front surface of the wiring substrate having an electronic component mounted thereon, to cover an area of a portion of the front surface. The wiring substrate includes a plurality of connecting portions formed thereon that ground the front surface and the back surface to the frame member. On a side on which the wiring substrate protrudes from the shield box, the shield box includes a shield wall member forming a wall surface substantially perpendicular to the wiring substrate. The shield wall member is grounded to at least one location of the connecting portions of the wiring substrate in the vicinity of the wall surface.

3 Claims, 5 Drawing Sheets

SHIELD STRUCTURE FOR ELECTRONIC APPARATUS

INCORPORATION BY REFERENCE

This application is based upon and claims the benefit of priority from the corresponding Japanese Patent Application No. 2012-263008 filed on Nov. 30, 2012, the entire contents of which are incorporated herein by reference.

BACKGROUND

The present disclosure relates to a shield structure for an electronic apparatus that shields a wiring substrate attached to an electronic apparatus.

Electronic apparatuses that form images on sheets by electrophotography, including, for example, image forming apparatuses such as a copier and a printer, are provided with a plurality of wiring substrates such as a drive system control substrate and an image processing substrate. Noise radiated from electronic components mounted on each of these wiring substrates causes the problem of malfunction of other electronic components.

Therefore, attempts have been made to shield radiation noise by accommodating, in a sealed space in a body frame made of sheet metal, wiring substrates having mounted thereon electronic components that generate radiation noise so as to shield the wiring substrates.

However, accommodating wiring substrates such as a drive system control substrate and an image processing substrate in the sealed space in the body frame is not easy both in terms of structure and cost.

As shown in the sectional view of FIG. 6, in a known conventional shield structure for a wiring substrate, a housing 101 that encloses a wiring substrate 30 having electronic components 31 and 32 mounted thereon is formed by a body 101A supporting the wiring substrate 30 from the underside and a lid portion 101B covering the body 101A from above. In this case, the lid portion 101B is fixed to the body 101A with a plurality of screws 21 disposed at a pitch interval that inhibits noise radiation. Additionally, a plurality of projection-like connecting portions 13 and 23 protruding toward the wiring substrate 30 side are formed in the body 101A and the lid portion 101B, respectively, and the wiring substrate 30 is sandwiched by the connecting portions 13 and 23. This allows the noise generating from the electronic components 31 and 32 to be fed back to the wiring substrate 30 in a small loop, thus preventing a state in which the housing 101 acts as an antenna to radiate noise.

SUMMARY

A shield structure for an electronic apparatus according to one aspect of the present disclosure shields an area of a portion of a wiring substrate attached to an electronic apparatus. The shield structure for an electronic apparatus includes a frame member and a shield box. The frame member is a conductive frame to which the wiring substrate is attached and covering a back surface of the wiring substrate. The shield box is formed on a front surface of the wiring substrate so as to cover an area of a portion of the front surface, the front surface having an electronic component mounted thereon. The wiring substrate includes a plurality of connecting portions formed thereon that ground the front surface and the back surface to the frame member. On a side on which the wiring substrate protrudes from the shield box, the shield box includes a shield wall member forming a wall surface substantially perpendicular to the wiring substrate. The shield wall member is grounded to at least one location of the connecting portions of the wiring substrate in the vicinity of the wall surface.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Hereinafter, an embodiment of the present disclosure will be described with reference to the accompanying drawings.

Figure 1:
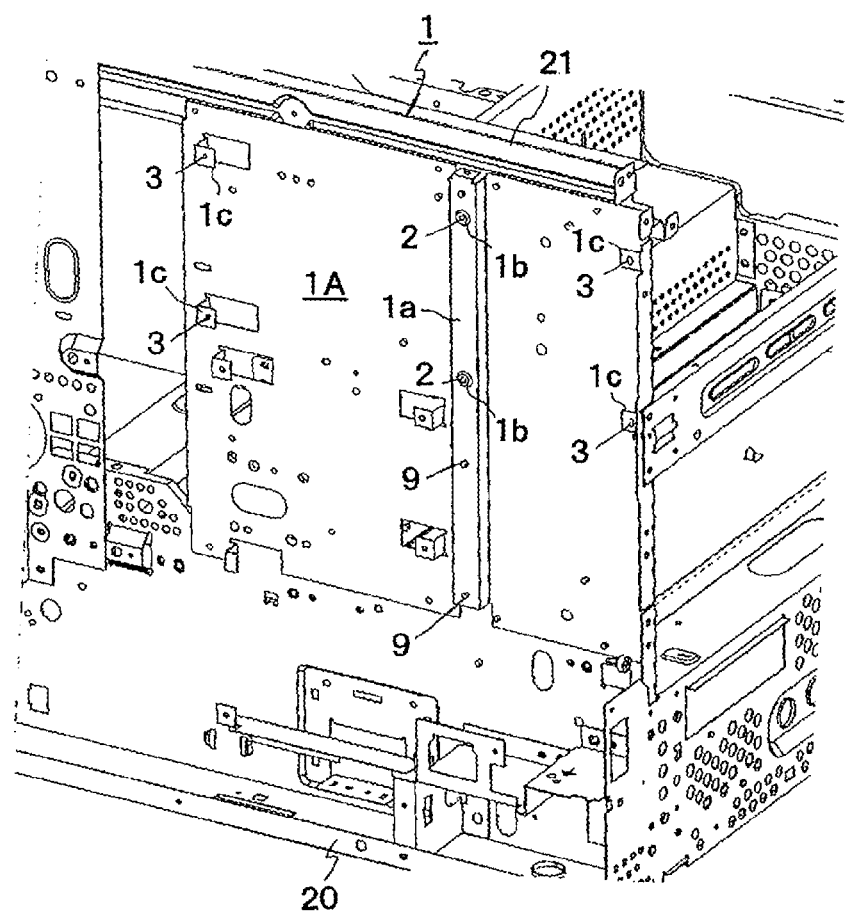
FIG. 1 is a partial perspective view showing a state before a substrate is attached to a body frame of an image forming apparatus including a shield structure according to one embodiment of the present disclosure.

As shown in FIG. 1, the body of an image forming apparatus according to the present embodiment, such as a copier, includes a body frame (housing) 1 that is made of sheet metal in the shape of a rectangular frame. A flat substrate attachment surface 1A is formed on one side (e.g., the back side) of the body frame 1. Also, a protruding portion 1a having a U-shaped cross section is formed integrally with the substrate attachment surface 1A along the vertical direction by bending the sheet metal. Bosses 1b are formed integrally with the protruding portion 1a in two upper and lower locations of the upper half of the protruding portion 1a. A screw hole 2 is formed at the center of each of the boss 1b.

At the left and right ends of the upper half of a region laterally divided by the protruding portion 1a of the substrate attachment portion 1A of the body frame 1, attachment stays 1c that are bent in an L-shape are formed at two upper and lower locations by cutting and bending. A screw hole 3 is formed in each of the attachment stays 1c. Additionally, the body frame 1 is connected to a back bottom frame 20 and a back top frame 21 with screws (not shown) near its ends in the vertical direction. Also, the right end portion of the body frame 1 is connected to a side frame 22 (see FIG. 4) with screws.

Figure 2:
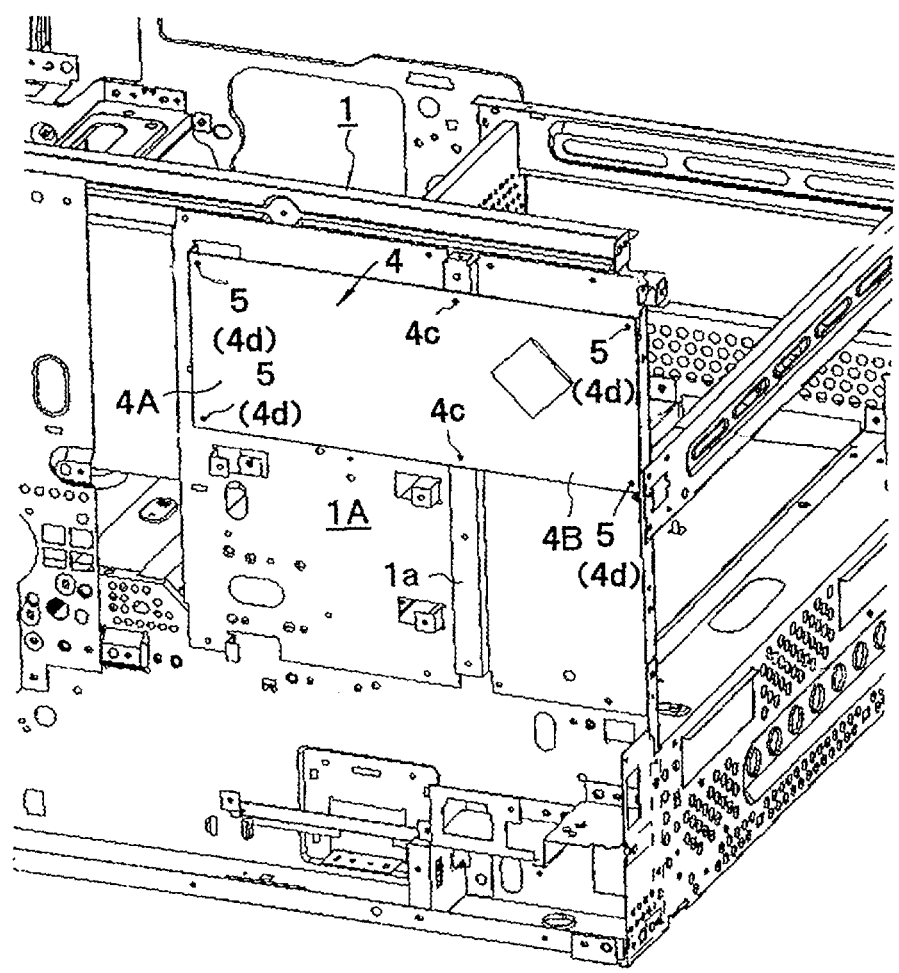
FIG. 2 is a partial perspective view showing a state in which the substrate is attached to the body frame of the image forming apparatus including the shield structure according to one embodiment of the present disclosure.

Then, as shown in FIG. 2, a wiring substrate 4 having a rectangular plate shape that is horizontally long is attached to the substrate attachment portion 1A of the body frame 1. The wiring substrate 4 is formed by integrating together a drive system control substrate and an image processing substrate, which have been conventionally formed as separate substrates, and includes a drive system control substrate portion 4A and an image processing substrate portion 4B. The drive system control substrate (drive system control substrate portion 4A) carries thereon a driver for a driving part such as a motor or a clutch, and an input portion for signals from sensing means, for example. The image processing substrate (image processing substrate portion 4B) is equipped with an ASIC or a CPU, for example.

Here, the wiring substrate 4 is formed as a multilayer substrate having two or more layers, and a plurality of electronic components (not shown) are mounted on the wiring substrate 4. Although not shown, a communication circuit pattern for communicating signals is disposed on the back surface of a boundary portion between the drive system control substrate portion 4A and the image processing substrate portion 4B of the wiring substrate 4. A power supply circuit pattern for power supply is disposed on the front surface of the boundary portion between the drive system control substrate portion 4A and the image processing substrate portion 4B. Then, a ground plane is disposed between the back surface and the front surface of the boundary portion between the drive system control substrate portion 4A and the image processing substrate portion 4B. Further, connecting portions 4c for grounding the ground plane are provided near opposite ends of the wiring substrate 4 in the vicinity of the boundary between the drive system control substrate portion 4A and the image processing substrate portion 4B.

In the state shown in FIG. 2, the wiring substrate 4 has attachment holes 4d formed at four corners thereof. The wiring substrate 4 is attached to the body frame 1 at the four corners via the attachment holes 4d by fastening screws 5 threadably engaging with the screw holes 3 of the attachment stays 1c formed at four locations of the body frame 1. After the wiring substrate 4 has been attached to the body frame 1 in this manner, a longitudinally elongated shield wall member 6 made of sheet metal is then attached to the protruding portion 1a of the body frame 1 so as to sandwich the wiring substrate 4 between itself and the protruding portion 1a of the body frame 1 as shown in FIG. 3.

Flanges 6a and 6b that are bent at a right angle in laterally opposite directions are formed at the far side end portion and the near side end portion of the shield wall member 6. Brackets 6c that are bent at a right angle are formed at two upper and lower locations of the upper half of the shield wall member 6 that correspond to the upper and lower locations of the wiring substrate 4. Also, the shield wall member 6 is attached to the protruding portion 1a of the body frame 1 by being fastened together with the wiring substrate 4 by screwing, into the screw holes 2 (see FIG. 1) of the bosses 1b formed at the upper and lower locations of the protruding portion 1a of the body frame 1, screws 7 for insertion through the brackets 6c formed at upper and lower locations of the upper half of the shield wall member 6 and the hole portions of the connecting portions 4c of the wiring substrate 4. Accordingly, in the wiring substrate 4, the area near the boundary portion between the drive system control substrate portion 4A and the image processing substrate portion 4B is brought into electrical conduction by the shield wall member 6 and the protruding portion 1a of the body frame 1. In a state in which the shield wall member 6 is attached to the protruding portion 1a of the body frame 1, the shield wall member 6 has a surface that is substantially perpendicular to the wiring substrate 4.

The lower half of the far side flange 6a of the shield wall member 6 is attached to the protruding portion 1a of the body frame 1 by screwing screws 8, which can be inserted through the flange 6a, into screw holes 9 (see FIG. 1) formed at two upper and lower locations of the lower half of the protruding portion 1a of the body frame 1.

Figure 3:
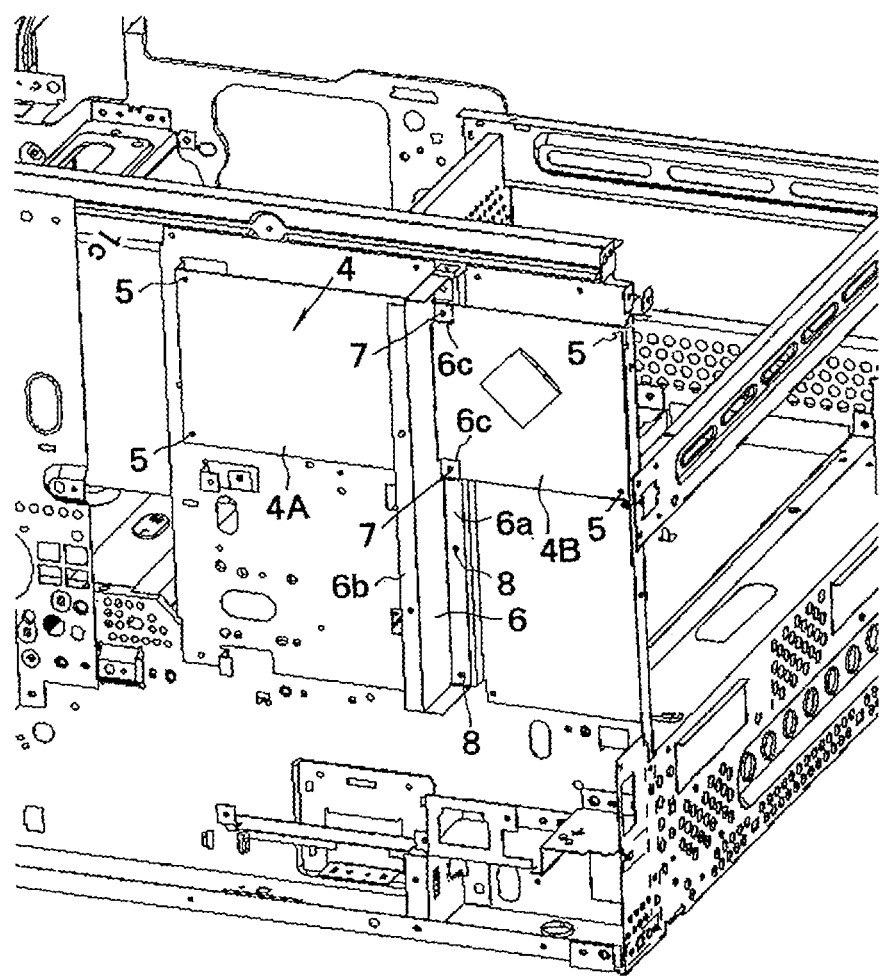
FIG. 3 is a partial perspective view showing a state in which the substrate and a shield wall member are attached to the body frame of the image forming apparatus including the shield structure according to one embodiment of the present disclosure.
Figure 4:
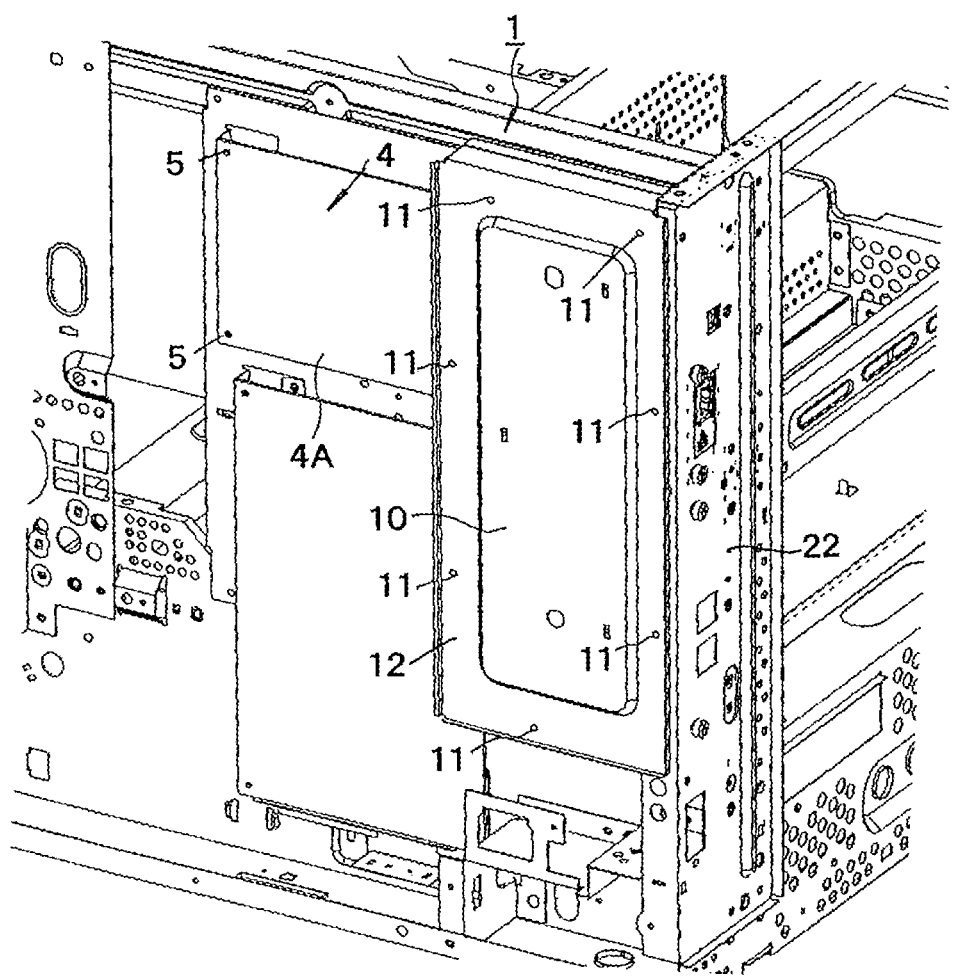
FIG. 4 is a partial perspective view showing a state in which the substrate attached to the body frame of the image forming apparatus including the shield structure according to one embodiment of the present disclosure is covered by a shield box.

Upon attachment of the shield wall member 6 to the protruding portion 1a of the body frame 1 as shown in FIG. 3, the side frame 22 also upstands in a direction perpendicular to the substrate attachment surface 1A so as to oppose the shield wall member 6 as shown in FIG. 4. Also, a lid member 10 that is a plate-shaped sheet metal member is attached to the body frame 1, the shield wall member 6, and the side frame 22 with a plurality of screws 11, and thereby, a shield box 12 is formed. Only the image processing substrate portion 4B of the wiring substrate 4 is covered by the shield box 12, and the drive system control substrate portion 4A of the wiring substrate 4 is exposed to the outside of the shield box 12.

Meanwhile, when the drive system control substrate and the image processing substrate of the image forming apparatus are constituted by separate wiring substrates and these separated wiring substrates are attached to the body frame 1, each of the wiring substrates needs to be attached to the body frame at its four corners using four screws, respectively. Thus, a total of eight screws are necessary for the two wiring substrates, and this results in the problem of an increase in the number of screws and operations for attachment, as well as the number of harnesses. Furthermore, there is also the problem of an increase in the overall costs of the wiring substrates of the apparatus when the drive system control substrate and the image processing substrate are separate wiring substrates.

However, with the shield structure having the above-described structure according to the present disclosure, the wiring substrate 4 is formed by integrating the drive system control substrate and the image processing substrate, which have been conventionally formed separately. Thus, it is possible to reduce the number of the screws 5 for attaching the wiring substrate 4 and eliminate the need for the harnesses between the drive system control substrate and the image processing substrate.

The integration of the drive system control substrate and the image processing substrate also leads to an increase in size of the shield box covering the entire integrated wiring substrate, resulting in increased costs.

However, with the shield structure according to the present disclosure, only the image processing substrate portion 4B of the wiring substrate 4 is covered by the shield box 12, and the drive system control substrate portion 4A of the wiring substrate 4 is exposed to the outside of the shield box 12. This makes it possible to reduce the size of the shield box 12 to lower the cost, and also facilitates the installation of wiring from the connector of the wiring substrate to the driving part and the sensing means, thus enhancing the ease of assembly and maintenance.

Figure 6:
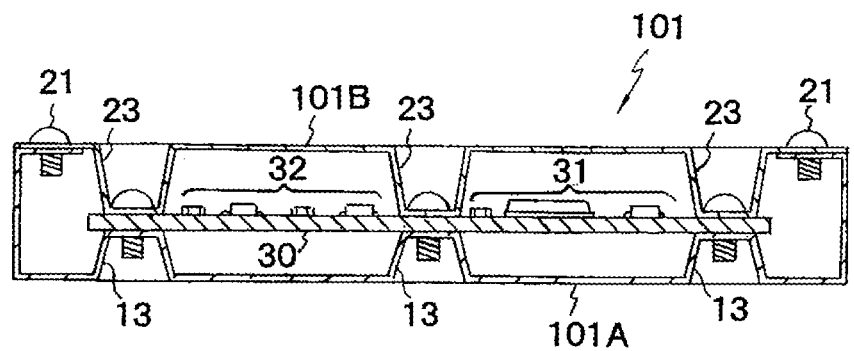
FIG. 6 is a sectional view showing a conventional shield structure.

Further, the configuration shown in FIG. 6 in which the entire wiring substrate 30 is covered by the housing 101 suffers the problem that it is necessary to install a harness for establishing connection to the drive member within the apparatus and form holes for the harness, and thus noise radiation cannot be reduced in a stable manner. Moreover, it is not easy to form the connecting portions 13 and 23 on the body 101A and the lid portion 101B, respectively, of the sheet metal housing 101 by deep drawing, imposing significant constraints on the arrangement pitch between the screws 21, for example. Here, a shield can is available as means for providing a small shield only for the area of a noise source. However, the shield can needs to be soldered to the substrate, and thus poses the problem of an increased number of operations. Further, shielding a CPU, an ASIC or the like by the shield can may cause breakage of the CPU, the ASIC and the like due to a temperature increase, and therefore it is necessary to provide a heat sink as cooling means or perform forced cooling using a fan, leading to the problems of increased structural complexity and higher costs.

In contrast, with the shield structure according to the present disclosure, the drive system control substrate and the image processing substrate are integrated into a single wiring substrate 4. Thereby, there is no need for a harness connecting the conventional drive system control substrate and image processing substrate that are separated from each other, and the wiring substrate 4 is grounded to the body frame 1 formed of a single sheet metal member. Accordingly, it is possible to minimize impedance mismatch, thus reducing noise radiation in a stable manner. In particular, the wiring substrate 4 is formed as a multilayer substrate, a communication circuit pattern for image processing and drive control is disposed on the back surface of the boundary portion between the drive system control substrate portion 4A and the image processing substrate portion 4B, a power supply circuit pattern is disposed on the front surface of the boundary portion, and a ground plane is disposed therebetween. Also, the connecting portions 4c are formed in the vicinity of opposite sides of the drive system control substrate portion 4A and the image processing substrate portion 4B, and the wiring substrate 4 is grounded to the body frame 1 together with the shield wall member 6. Thereby, the size of the loop of noise current can be reduced without causing the damping of signals, thus suppressing radiation of noise generated from the communication pattern, the power supply pattern, or the like to a small degree. That is, by decreasing the number of screws and harnesses and reducing the size of the shield box, the noise radiation from the wiring substrate 4 can be reduced in a stable manner without an increase in costs.

Figure 5:
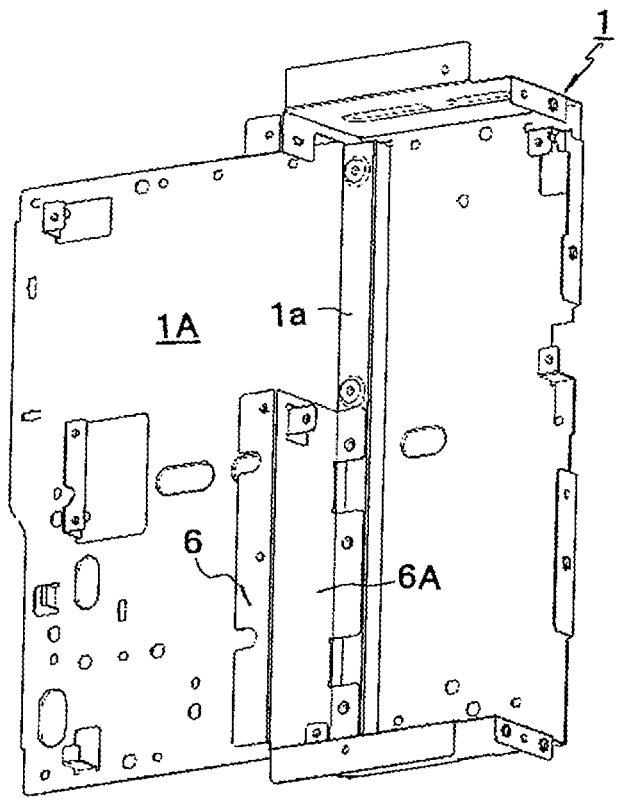
FIG. 5 is a partial perspective view of the body frame showing a different form of the shield structure according to one embodiment of the present disclosure.

Incidentally, a configuration as shown in the partial perspective view in FIG. 5 is possible in which the shield wall member 6 is divided into two pieces, and one of the divided pieces is provided as a separate member (not shown) for sandwiching the wiring substrate 4 between itself and the protruding portion 1a of the body frame 1. In this case, the wiring substrate 4 may be attached to and detached from the body frame 1 by removing only the divided piece from the body frame 1. By doing so, at the time of attachment/removal of the wiring substrate 4, the substrate can be easily attached to or removed from the body frame 1 by removing only the divided piece (not shown) from the body frame 1 while leaving the other half 6A of the shield wall member 6 on the body frame 1 as shown in FIG. 5, thus enhancing the attachability and removability.

It is to be understood that the embodiments herein are illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A shield structure for an electronic apparatus that shields an area of a portion of a wiring substrate attached to an electronic apparatus, comprising:
    a conductive frame member to which the wiring substrate is attached and covering a back surface of the wiring substrate; and
    a shield box formed on a front surface of the wiring substrate so as to cover an area of a portion of the front surface, the front surface having an electronic component mounted thereon,
    wherein the wiring substrate includes a plurality of connecting portions formed thereon that ground the front surface and the back surface to the frame member, and,
    on a side on which the wiring substrate protrudes from the shield box, the shield box includes a shield wall member forming a wall surface substantially perpendicular to the wiring substrate, and the shield wall member is grounded to at least one location of the connecting portions of the wiring substrate in the vicinity of the wall surface,
    wherein the shield wall member and the wiring substrate are attached to the frame member by being fastened together at the connecting portions, and the wiring substrate is sandwiched between the shield wall member and the frame member, and
    wherein the shield wall member is divided into two pieces, and the wiring substrate is attachable to and removable from the frame member by removing only one of the divided pieces from the frame member.

2. A shield structure for an electronic apparatus that shields an area of a portion of a wiring substrate attached to an electronic apparatus, comprising:
    a conductive frame member to which the wiring substrate is attached and covering a back surface of the wiring substrate; and
    a shield box formed on a front surface of the wiring substrate so as to cover an area of a portion of the front surface, the front surface having an electronic component mounted thereon,
    wherein the wiring substrate includes a plurality of connecting portions formed thereon that ground the front surface and the back surface to the frame member, and,
    on a side on which the wiring substrate protrudes from the shield box, the shield box includes a shield wall member forming a wall surface substantially perpendicular to the wiring substrate, and the shield wall member is grounded to at least one location of the connecting portions of the wiring substrate in the vicinity of the wall surface,
    wherein, in the frame member, an attachment portion for attaching the wiring substrate and a shielding portion covering the back surface and an abutting portion abutting the connecting portions are formed from a single sheet metal member, and
    wherein the shield wall member is divided into two pieces, and the wiring substrate is attachable to and removable from the frame member by removing only one of the divided pieces from the frame member.

3. A shield structure for an electronic apparatus that shields an area of a portion of a wiring substrate attached to an electronic apparatus, comprising:
    a conductive frame member to which the wiring substrate is attached and covering a back surface of the wiring substrate; and
    a shield box formed on a front surface of the wiring substrate so as to cover an area of a portion of the front surface, the front surface having an electronic component mounted thereon,
    wherein the wiring substrate includes a plurality of connecting portions formed thereon that ground the front surface and the back surface to the frame member, and,
    on a side on which the wiring substrate protrudes from the shield box, the shield box includes a shield wall member forming a wall surface substantially perpendicular to the wiring substrate, and the shield wall member is grounded to at least one location of the connecting portions of the wiring substrate in the vicinity of the wall surface, wherein the wiring substrate is a multilayer substrate having two or more layers, and wherein a communication circuit pattern for image processing and drive control is disposed on a back surface of a boundary portion between a drive system control substrate portion and an image processing substrate portion of the wiring substrate, a power supply circuit pattern is disposed on a front surface of the boundary portion, and a ground plane is disposed therebetween.

* * * * *